United States Patent
Lorraine et al.

[11] Patent Number: 5,559,388
[45] Date of Patent: Sep. 24, 1996

[54] HIGH DENSITY INTERCONNECT FOR AN ULTRASONIC PHASED ARRAY AND METHOD FOR MAKING

[75] Inventors: Peter W. Lorraine; Lowell S. Smith, both of Niskayuna, N.Y.

[73] Assignee: General Electric Company, Schenectady, N.Y.

[21] Appl. No.: 398,336

[22] Filed: Mar. 3, 1995

[51] Int. Cl.$^6$ .............................. H01L 41/04; H03H 9/00
[52] U.S. Cl. .......................... 310/334; 310/327; 310/335
[58] Field of Search ................................... 310/327, 334, 310/335

[56] References Cited

U.S. PATENT DOCUMENTS

| | | | |
|---|---|---|---|
| 4,282,453 | 8/1981 | Knight et al. | 310/335 |
| 4,310,957 | 1/1982 | Sachs | 310/334 |
| 4,385,255 | 5/1983 | Yamaguchi et al. | 310/335 |
| 4,442,715 | 4/1984 | Brisken et al. | 73/626 |
| 4,492,120 | 1/1985 | Lewis et al. | 310/334 |
| 4,611,141 | 9/1986 | Hamada et al. | 310/334 |
| 4,676,106 | 6/1987 | Nagai et al. | 310/334 |
| 5,267,221 | 11/1993 | Miller et al. | 310/327 |
| 5,295,487 | 3/1994 | Saitoh et al. | 310/334 |
| 5,329,498 | 7/1994 | Greenstein | 310/327 |
| 5,457,863 | 10/1995 | Thomas et al. | 310/334 |

OTHER PUBLICATIONS

Kojima, Matrix Array Transducer and Flexible Matrix Array Transducer, IEEE Ultrasonics, 1986, pp. 649–654.
Pappalardo, Hybrid Linear and Matrix Acoustic Arrays, Ultrasonics, Mar. 1981, pp. 81–86.
Smith et al., Two Dimensional Arrays for Medical Ultrasound, Ultrasonic Imaging, vol. 14, pp. 213–233 (1992).
Smith et al., Two Dimensional Array Transducer Using Hybrid Connection Technology, IEEE Ultrasonics Symposium, 1992, pp. 555–558.

*Primary Examiner*—Thomas M. Dougherty
*Attorney, Agent, or Firm*—David C. Goldman; Marvin Snyder

[57] ABSTRACT

The present invention discloses a high density interconnect for an ultrasonic phased array and method for making. The high density interconnect includes a backfill material having grooves formed therein. Each of the grooves are separated a predetermined distance from each other and have a predetermined groove depth. A conducting material is deposited in each of the grooves. The grooved backfill is cut or formed into sections having different lengths. The sections are then reconsolidated into an unitary structure, wherein one end of the structure is electrically conductive in one direction. One surface of the high density interconnect is metallized for bonding with an ultrasonic phased array transducer while the other side is patterned with solder bumps for connection to integrated circuit boards or flexible circuit boards.

3 Claims, 3 Drawing Sheets

HIGH DENSITY INTERCONNECT FOR AN ULTRASONIC PHASED ARRAY AND METHOD FOR MAKING

BACKGROUND OF THE INVENTION

The present invention relates generally to an ultrasonic phased array transducer and more particularly to a method for forming a high density interconnect for an ultrasonic phased array transducer.

An ultrasonic phased array transducer that is used in medical and industrial applications includes one or more piezoelectric elements placed between a pair of electrodes. The electrodes are connected to a voltage source. When a voltage is applied, the piezoelectric elements are excited at a frequency corresponding to the applied voltage. As a result, the piezoelectric element emits an ultrasonic beam of energy into a media that it is coupled to at frequencies corresponding to the convolution of the transducer's electrical/acoustical transfer function and the excitation pulse. Conversely, when an echo of the ultrasonic beam strikes the piezoelectric elements, each element produces a corresponding voltage across its electrodes.

In addition, the ultrasonic phased array typically includes acoustic matching layers coupled to the piezoelectric elements. The acoustic matching layers transform the acoustic impedance of the patient or object to a value closer to that of the piezoelectric element. This improves the efficiency of sound transmission to the patient/object and increases the bandwidth over which sound energy is transmitted. Also, the ultrasonic phase array includes an acoustic backing layer (i.e., a backfill) coupled to the piezoelectric elements opposite to the acoustic matching layers. The backfill has a low impedance in order to direct the ultrasonic beam towards the patient/object. Typically, the backfill is made from a lossy material that provides high attenuation for diminishing reverberations.

In order to maintain electrical and acoustical isolation in the ultrasonic phased array, the array of piezoelectric elements need to be separated. Typically, the piezoelectric elements are separated by using a dicing saw or by laser machining. Electrical connections made through the backfill layer must not interfere with the acoustic properties (i.e. high isolation, high attenuation, and backfill impedance). In certain applications such as 1.5 or 2 dimensional arrays, there is a very small profile which makes it extremely difficult to make electrical connections without interfering with the acoustic properties of the ultrasonic phased array.

Wires or flexible circuit boards bonded to the piezoelectric elements have been used to overcome this interconnect problem. However, these schemes are difficult to implement with very small piezoelectric elements or in 2 dimensional (2D) arrays, since backfill properties or acoustic isolation may be compromised. An example of a handwiring scheme that is not practicable for commercial manufacturing is disclosed in Kojima, *Matrix Array Transducer and Flexible Matrix Array Transducer*, IEEE ULTRASONICS, 1986, pp. 649–654. An example of another scheme that has been disclosed in Pappalardo, *Hybrid Linear and Matrix Acoustic Arrays*, ULTRASONICS, March 1981, pp. 81–86, is to stack individual lines of array piezoelectric elements including the backfill. However, the scheme disclosed in Pappalardo is deficient because there is poor dimensional control. In Smith et al., *Two Dimensional Arrays for Medical Ultrasound*, ULTRASONIC IMAGING, vol. 14, pp. 213–233 (1992), a scheme has been disclosed which uses epoxy wiring guides with conducting epoxy and wire conductors. However, the scheme disclosed in Smith et al. is deficient because it suffers from poor manufacturability and acoustic properties. Also, a three dimensional (3D) ceramic interconnect structure based multi-layer ceramic technology developed for semiconductor integrated circuits has been disclosed in Smith et al., *Two Dimensional Array Transducer Using Hybrid Connection Technology*, IEEE ULTRASONICS SYMPOSIUM, 1992, pp. 555–558. This scheme also suffers from poor manufacturability and acoustic properties.

SUMMARY OF THE INVENTION

Therefore, it is a primary objective of the present invention to provide a high density interconnect for an ultrasonic phased array transducer which does not interfere with acoustic properties, such as high isolation between piezoelectric elements, high attenuation, and low impedance.

A second object of the present invention is to form electrical connections to an ultrasonic phased array transducer through a backfill with uniaxial conductivity.

Another object of the present invention is to form a backfill with uniaxial conductivity by producing conducting channels in a planar structure, which is cut and rearranged to achieve a desired geometry.

Still another object of the present invention is to form conducting channels in a planar structure either by cutting with a dicing saw or laser machining or by molding the conducting channels.

A fifth object of the present invention is to reconsolidate the cut planar structure and stagger the sections into a convenient surface for direct mounting of flexible circuit boards.

Another object of the present invention is to pattern solder pads on the backfill for making flexible electrical connections to either cables, flexible circuit boards, or directly to integrated electronics.

Thus, in accordance with the present invention, there is provided a method for forming a high density interconnect for an ultrasonic phased array. The method comprises forming a plurality of grooves in a planar structure. Each of the plurality of grooves are separated a predetermined distance from each other and have a predetermined groove depth. A conducting material is deposited in each of the plurality of grooves. The structure is reconsolidated into an alternate orientation. The reconsolidated structure is attached to the piezoelectric elements of the ultrasonic phased array at an end opposite of the plurality of matching layers, wherein one end is electrically conductive in one direction.

While the present invention will hereinafter be described in connection with an illustrative embodiment and method of use, it will be understood that it is not intended to limit the invention to this embodiment. Instead, it is intended to cover all alternatives, modifications and equivalents as may be included within the spirit and scope of the present invention as defined by the appended claims.

DETAILED DESCRIPTION OF THE PRESENT INVENTION

Figure 1:
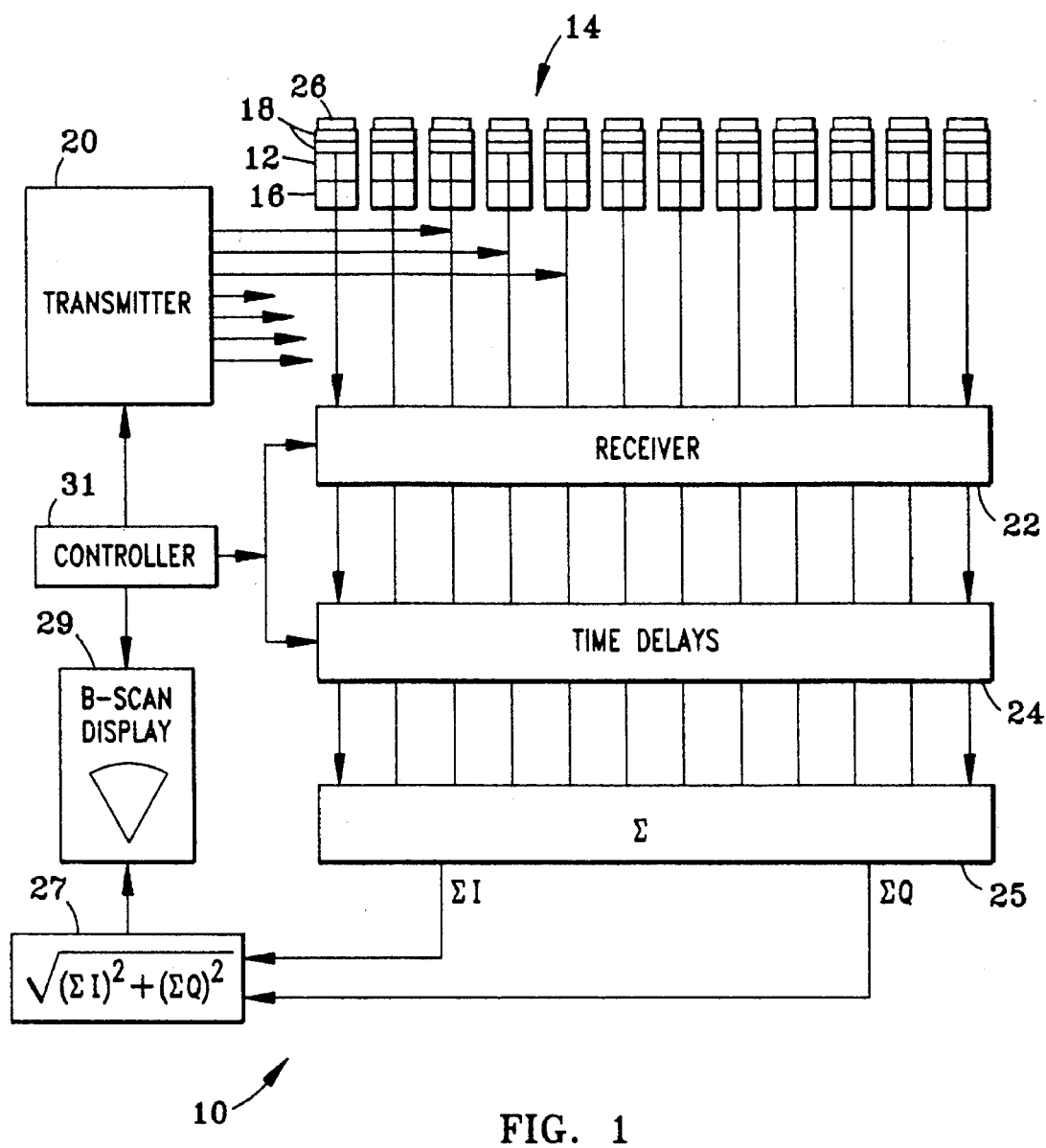
FIG. 1 is a schematic of an ultrasonic phased array transducer and associated transmitter/receiver electronics.

FIG. 1 is a schematic of an ultrasonic phased array imager 10 which is used in medical and industrial applications. The imager 10 includes a plurality of piezoelectric elements 12 defining a phased array 14. The piezoelectric elements are preferably made from a piezoelectric or relaxor material such as lead zirconium titanate (PZT) and are separated to prevent cross-talk and have an isolation in excess of 20 decibels. A backfill layer 16 is coupled at one end of the phased array 14. The backfill layer 16 is highly attenuating and has low impedance for preventing ultrasonic energy from being transmitted or reflected from behind the piezoelectric elements 12 of the phased array 14. Backfill layers having fixed acoustical properties are well known in the art and are used to damp the ultrasonic energy transmitted from the piezoelectric elements 12. The backfill layer in the present invention is preferably made from a combination of hard particles in a soft matrix such as dense metal or metal oxides powder in silicone rubber and distributed through an epoxy matrix. Acoustic matching layers 18 are coupled to an end of the phased array 14 opposite from the backfill layer 16. The matching layers 18 provide suitable matching impedance to the ultrasonic energy as it passes between the piezoelectric elements 12 of the phased array 14 and the patient/object. In the illustrative embodiment, there are two matching layers preferably made from a polymer having an acoustic impedance ranging from about 1.8 Mrayls to about 2.5 Mrayls and a composite material having an acoustic impedance ranging from about 6 Mrayls to about 12 Mrayls.

A transmitter 20 controlled by a controller 31 applies a voltage to the plurality of piezoelectric elements 12 of the phased array 14. A beam of ultrasonic beam energy is generated and propagated along an axis through the matching layers 18 and a lens 26. The matching layers 18 broaden the bandwidth (i.e., damping the beam quickly) of the beam and the lens 26 directs the beam to a patient/object. The backfill layer 16 prevents the ultrasonic energy from being transmitted or reflected from behind the piezoelectric elements 12 of the phased array 14. Echoes of the ultrasonic beam energy return from the patient/object, propagating through the lens 26 and the matching layers 18 to the PZT material of the piezoelectric elements 12. The echoes arrive at various time delays that are proportional to the distances from the ultrasonic phased array 14 to the patient/object causing the echoes. As the echoes of ultrasonic beam energy strike the piezoelectric elements, a voltage signal is generated and sent to a receiver 22. The voltage signals at the receiver 22 are delayed by an appropriate time delay at a time delay means 24 set by the controller 31. The delay signals are then summed at a summer 25 and a circuit 27. By appropriately selecting the delay times for all of the individual piezoelectric elements and summing the result, a coherent beam is formed. The coherent beam is then displayed on a B-scan display 29 that is controlled by the controller 31. A more detailed description of the electronics connected to the phased array is provided in U.S. Pat. No. 4,442,715, which is incorporated herein by reference.

Figure 2:
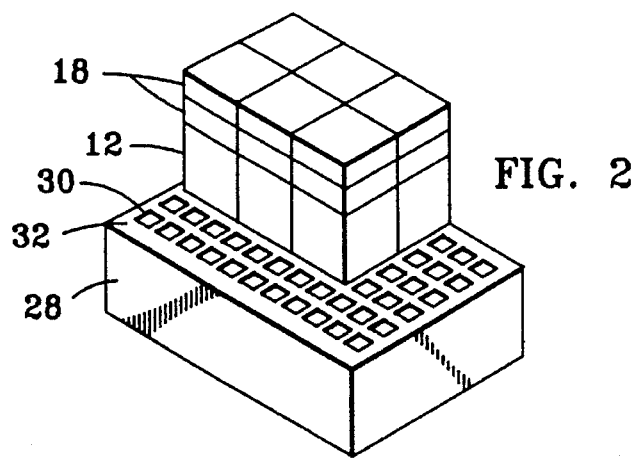
FIG. 2 is a schematic of a high density interconnect with the ultrasonic phased array.

FIG. 2 is a schematic showing a high density interconnect 28 used with the ultrasonic phased array transducer 14. The high density interconnect includes a unitary structure of backfill material having conducting channels or grooves 30 through its thickness. The backfill interconnect 28 is attached to the array of piezoelectric elements 12 and the matching layers 18. The surface 32 of the high density interconnect having exposed ends of the grooves is metallized and bonded to a laminated assembly of PZT and matching layers. The individual elements are isolated by subsequent cutting with a dicing saw or other means. The other side of the backfill material is patterned with solder bumps for attachment of cables, flexible circuits, or integrated electronics. In this implementation, the backfill interconnect 28 does not compromise the inter-element isolation or other backfill properties of the ultrasonic phased array transducer 14.

Figure 3A:
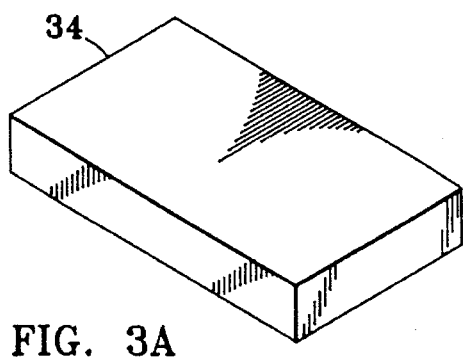
FIGS. 3A–3E illustrate a schematic method of fabricating the high density interconnect according to the present invention.
Figure 3B:
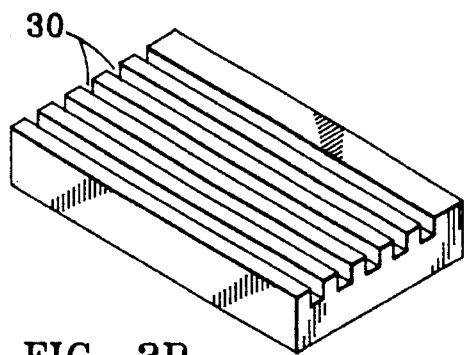

FIGS. 3A–3E illustrate a schematic method of fabricating the high density interconnect 28 according to the present invention. The specific processing conditions and dimensions serve to illustrate the present method but can be varied depending upon the materials used and the desired application and geometry of the phased array transducer. First, as shown in FIG. 3A, a rectangular slab of backfill material 34 such as epoxy loaded with particles of dense metal or metal oxide imbedded in silicone rubber is machined parallel at the sides to form a backfill layer. Then, in FIG. 3B, a plurality of grooves 30 are formed in a planar section of the backfill layer. The plurality of grooves 30 are formed in the surface of the backfill layer by either direct molding, dicing, scribing, or laser machining or conventional machining. The grooves are separated from each other at a predetermined distance that is equal to the final array inter-element spacing. In the present invention, there may be about 150 grooves, that each have a width ranging from about 10 μm–100 μm. Also, each of the grooves have a depth that may range from about 20 μm–200 μm so that there is low electrical resistance from the piezoelectric elements 12 to any attached electronics. In addition, each of the grooves are formed on the backfill material at a pitch ranging from 50 μm–500 μm. In the illustrative embodiment, there are about 150 grooves, each having a 50 μm width, a 100 μm depth, on a 250 μm pitch.

Figure 3C:
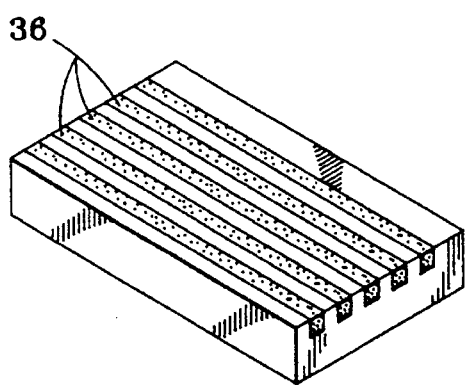

Once the plurality of grooves 30 have been formed in the backfill layer, conducting material 36 is deposited in each of the plurality of grooves (FIG. 3C). The conducting material is deposited in each of grooves by chemical vapor deposition, sputtering, plating, or evaporation. In the present invention, the conducting material may be deposited metal such copper, silver, or gold. Electrical isolation between the plurality of conducting grooves is attained by lapping the surface with a grinding wheel.

Figure 3D:
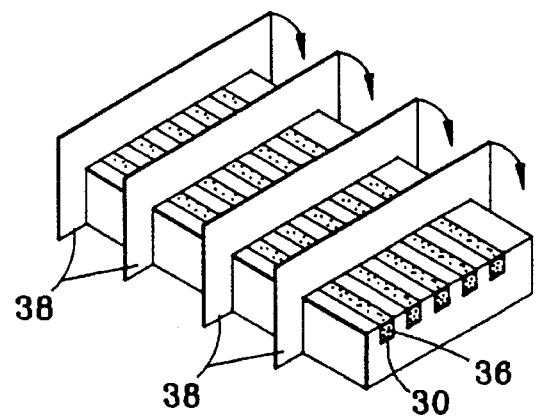
Figure 3E:
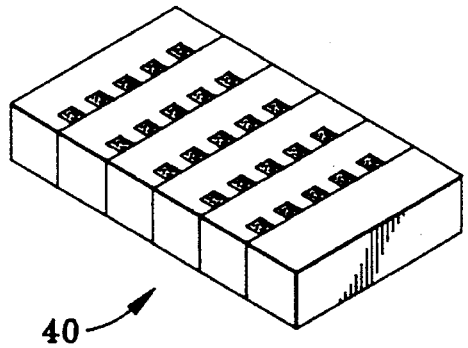

After the plurality of grooves 30 have been lapped, the backfill layer 16 is cut into a plurality of sections 38 with a dicing saw as shown in FIG. 3D. After the backfill layer has been cut, the plurality of sections 38 are rotated and reconsolidated into an unitary structure 40 as shown in FIG. 3E. The reconsolidation is attained by laminating the sections together with epoxy adhesive. The result is an unitary structure that is electrically conductive in one direction. Note that it is possible to obtain the sections by injection molding. The final structure would be an assembly of the injection molded sections. In the illustrative embodiment, the structure will have over 1000 interconnects. After the reconsolidation, solder pads may be patterned on an exposed end of the grooves of the backfill material for direct attachment of cables, flexible circuit boards, or integrated electronics, while the other side of the backfill interconnect is metallized for bonding the ultrasonic phased array transducer 14 thereto.

Figure 4:
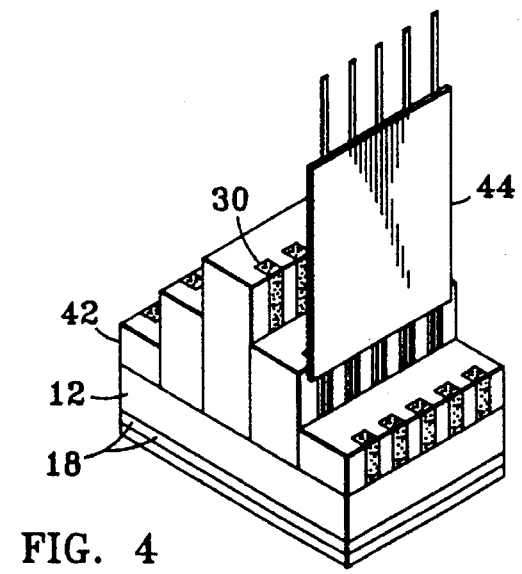
FIG. 4 is a schematic of the high density interconnect according to a second embodiment of the present invention with the ultrasonic phased array.

FIG. 4 is a schematic showing a second embodiment 42 of the high density interconnect used with the ultrasonic phased array transducer 14. The high density interconnect 42 includes a staggered unitary structure of backfill material having conducting channels or grooves 30 through its thickness. The backfill interconnect 42 is attached to the array of piezoelectric elements 12 and the matching layers 18. The surface of the staggered high density interconnect having exposed ends of the grooves is metallized and bonded to a laminated assembly of PZT and matching layers. The individual elements are isolated by subsequent cutting with a dicing saw or other means. The other side is patterned with solder bumps for attachment of cables, flexible circuits, or integrated electronics 44. In this implementation, the backfill interconnect 42 does not compromise the inter-element isolation or other backfill properties of the ultrasonic phased array transducer 14.

Figure 5A:
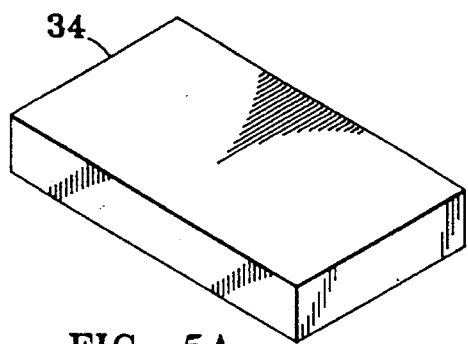
FIGS. 5A–5E illustrate a schematic method of fabricating the high density interconnect according to a second embodiment of the present invention.
Figure 5B:
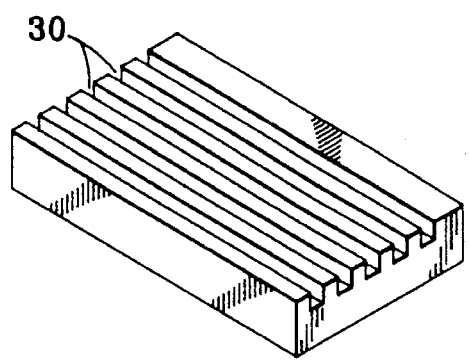
Figure 5C:
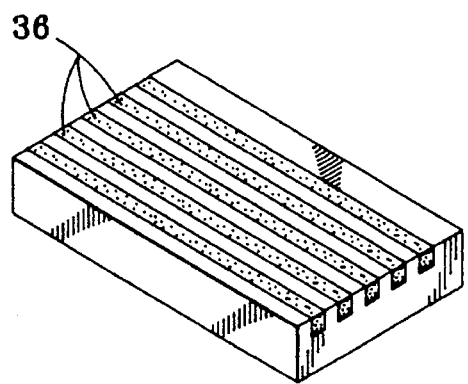
Figure 5D:
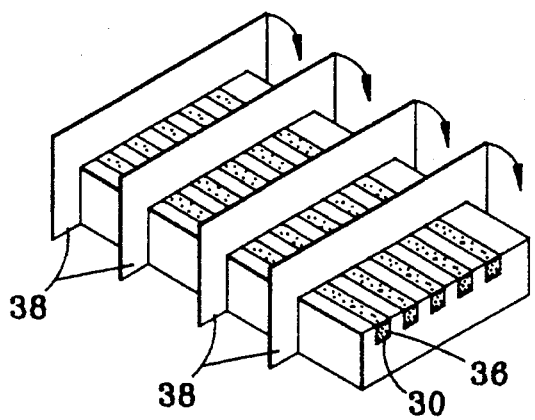
Figure 5E:
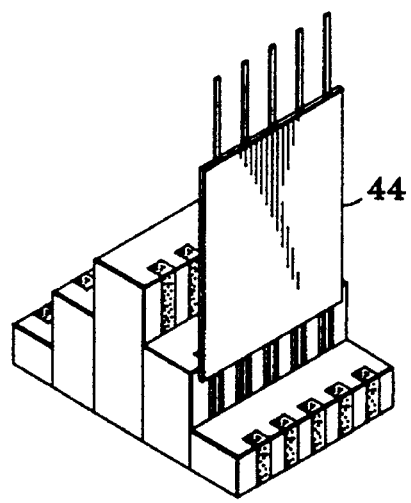

FIGS. 5A–5E illustrate a schematic method of fabricating the staggered high density interconnect 42 according to the second embodiment of the present invention. First, as shown in FIG. 5A, a rectangular slab of a backfill material 34 such as epoxy loaded with particles of dense metal or metal oxide imbedded in silicone rubber are machined parallel at the sides to form a backfill layer. Then, in FIG. 5B, a plurality of grooves 30 are formed in a planar section of the backfill layer. Once the plurality of grooves 30 have been formed in the backfill layer, conducting material 36 is deposited in each of the plurality of grooves (FIG. 5C). The conducting material is deposited in each of grooves by chemical vapor deposition, sputtering, or evaporation. After the plurality of grooves 30 have been lapped, the backfill layer is cut into a plurality of sections 38 having different lengths with a dicing saw as shown in FIG. 5D. After the backfill layer has been cut, the plurality of sections 38 are rotated and staggered into an unitary structure 42 as shown in FIG. 5E. Note that it is possible to obtain the staggered unitary structure by injection molding. The result is a unitary staggered structure that permits direct connection with flexible circuit boards 44 to transition between the backfill interconnect and a cable bundle. By staggering the structure, significantly more contact area is available for electrical connections to systems electronics. This feature is important for dense arrays. After staggering the sections into a unitary structure, solder pads, anisotropic bonding adhesives, or wire bonding, may be patterned on an exposed edge of the grooves of the backfill material for direct attachment of cables or electronics, while the other side of the backfill interconnect is metallized for bonding to the ultrasonic phased array transducer 14.

It is therefore apparent that there has been provided in accordance with the present invention, a method for forming a high density interconnect for an ultrasonic phased array that fully satisfy the aims and advantages and objectives hereinbefore set forth. The invention has been described with reference to several embodiments, however, it will be appreciated that variations and modifications can be effected by a person of ordinary skill in the art without departing from the scope of the invention.

We claim:

1. A high density interconnect for an ultrasonic phased array having an array of piezoelectric elements and a plurality of matching layers coupled to the piezoelectric elements at one end, the high density interconnect comprising:

a backfill material formed from a plurality of sections of backfill material of varying lengths coupled to each other, wherein each section of backfill material is staggered into a different height and coupled to each other, each section of backfill material having a plurality of grooves therein, each of the plurality of grooves separated a predetermined distance from each other and having a predetermined groove depth; each of the plurality of grooves containing a metallized conducting material therein, the sectioned backfill material attached to the piezoelectric elements of the ultrasonic phased array at an end opposite of the plurality of matching layers.

2. A high density interconnect according to claim 1, wherein the plurality of grooves is patterned with solder pads on an exposed edge of the grooves of the sectioned backfill material.

3. A high density interconnect according to claim 2, further comprising electronics attached to the solder pads.

\* \* \* \* \*